United States Patent [19]

Capone et al.

[11] Patent Number: 5,053,385

[45] Date of Patent: * Oct. 1, 1991

[54] PREFERENTIAL ORIENTATION OF METAL OXIDE SUPERCONDUCTING MATERIALS

[75] Inventors: Donald W. Capone, Bolingbrook; Roger B. Poeppel, Glen Ellyn, both of Ill.

[73] Assignee: Arch Development Corporation, Argonne, Ill.

[*] Notice: The portion of the term of this patent subsequent to Jul. 17, 2007 has been disclaimed.

[21] Appl. No.: 390,930

[22] Filed: Aug. 7, 1989

Related U.S. Application Data

[63] Continuation of Ser. No. 101,821, Sep. 28, 1987, abandoned.

[51] Int. Cl.$^5$ .................... B29C 47/00; C04B 35/00; H01L 39/12
[52] U.S. Cl. .......................... 505/1; 264/24; 264/28; 264/63; 264/108; 505/740; 505/741
[58] Field of Search ............. 505/741; 505/1; 264/24, 264/28, 63, 108, 140

[56] References Cited

U.S. PATENT DOCUMENTS

| 4,824,826 | 4/1989 | Damento et al. | 252/518 |
|---|---|---|---|
| 4,942,151 | 7/1990 | Capone | 264/63 |
| 4,973,575 | 11/1990 | Capone | 505/1 |
| 4,975,411 | 12/1990 | Danby et al. | 505/1 |

FOREIGN PATENT DOCUMENTS 8809312 12/1988 PCT Int'l Appl. ............. 505/1

OTHER PUBLICATIONS

Reed *Intro. to the Principles of Ceramic Processing*, John Wiley & Sons: New York, pp. 449–461.
Lin "Superconductivity and Structure of Single Crystal YBa$_2$Cu$_3$O$_x$," *Physics Letters A* vol. 121 (6), May 4, 1987, pp. 305–306.
Robinson "IBM Superconductor Leaps Current Hurdle" *Research News*, Jun. 5, 1987, p. 1189.
Ekin "Transport Critical Current in Bulk Sintered YBa$_2$Cu$_3$O$_x$", *Adv. Cer. Mat'ls.* vol. 2, (3B), Jul. 1987, pp. 586–592.
Cimo "Powder Processing for Microstructural Control. . ." *Adv. Cer. Mat'l* vol. 2 (3B) Special Issue, Jul. 1987, pp. 329–376.
Johnson, D. W. Jr. et al., "Fabrication of. . . Oxides", *High Temperature Superconductors*, Proc. 1987 Spring Meeting of Mat. Res. Soc., pp. 193–195, Apr. 23–24, 1987.
Moriwaki, K. et al.: "Electrical Properties. . . Thin Films", *High Temperature Superconductors*, Mat. Res. Soc., pp. 85–87, 4-23-24-87.
Poeppel, R. B. et al., "Fabrication. . . Ceramics", *ACS Symposium Series* 351, pp. 261–265, Aug. 30–Sep. 4, 1987.

*Primary Examiner*—Paul Lieberman
*Assistant Examiner*—John Boyd
*Attorney, Agent, or Firm*—Emrich & Dithmar

[57] ABSTRACT

A polycrystalline metal oxide such as YBa$_2$Cu$_3$O$_{7-x}$ (where $0<X<0.5$) exhibits superconducting properties and is capable of conducting very large current densities. By aligning the two-dimensional Cu-O layers which carry the current in the superconducting state in the a- and b-directions, i.e., within the basal plane, a high degree of crystalline axes alignment is provided between adjacent grains permitting the conduction of high current densities.

3 Claims, 1 Drawing Sheet

PREFERENTIAL ORIENTATION OF METAL OXIDE SUPERCONDUCTING MATERIALS

CONTRACTUAL ORIGIN OF THE INVENTION

This invention was made with Government support under Contract Number W-31-109-ENG-38 awarded by the United States Department of Energy. The Government has certain rights in the invention.

This is a continuation of application Ser. No. 101,821, filed Sept. 28, 1987, now abandoned.

BACKGROUND OF THE INVENTION

This invention relates generally to the fabrication and composition of superconducting materials and is particularly directed to the preferential orientation of the crystals of a superconducting material to permit the conduction of large current densities.

Certain metals, alloys, and chemical compounds known as superconductors exhibit zero electrical resistivity and complete diamagnetism at very low temperatures and magnetic fields. The transition of a metal from normal electrical conducting properties to superconducting properties depends primarily on (1) the temperature and (2) the magnetic field at the surface of the metal. The superconductive state of the metal exists for temperatures less than its characteristic critical temperature, $T_c$. The most practical superconducting materials exhibit very low critical temperatures, i.e., on the order of 4-23K. However, recent developments have produced new superconducting materials, based on oxides, having critical temperatures on the order of 100K.

Superconductors also exhibit a characteristic critical electric current density, $J_c$, measured in amps/cm$^2$. By increasing the current density in a superconducting material to its $J_c$ characteristic value, it can be driven into a normal conducting state. Thus, the current density at which this transition occurs is termed the conductive material's critical current density. It is of course desirable for a superconductor to have a high critical current density to allow it to conduct large currents while remaining superconductive.

In practical Type II superconductors efforts to increase the critical current density have involved the incorporation of microstructural defects in the material. A magnetic field applied to the superconductor penetrates the material in the form of small bundles, or vortices, of magnetic flux which can move about within the material as it conducts current. Movement of these magnetic vortices is a dissipative process characterized by resistive heating and thus represents a limitation in the material's current carrying capacity. Incorporation of the aforementioned microstructural defects within the material prevents the magnetic vortices from moving within the superconductor in response to current flowing therein. By preventing the movement of these magnetic vortices, the material's critical current density can be substantially increased before the material assumes normal, non-superconducting current conducting operation.

The class of metal oxide superconductors unfortunately exhibit very small critical current densities. For example, these materials typically have a critical current density in the presence of magnetic fields on the order of 5-10 amps/cm$^2$, while other practical superconductors typically are capable of supporting current densities on the order of 10,000-100,000 amps/cm$^2$. As a result, these metal oxide materials have heretofore been of limited use in superconducting applications. Recent investigations have indicated that low critical electric current density values are not an intrinsic problem with metal oxide superconductors, since single crystal, thin film metal oxide superconducting materials have been produced which are capable of supporting very large current densities.

The present invention addresses the aforementioned limitations of prior art metal oxide superconducting materials by allowing such materials to be used in very high current density applications. By aligning the crystalline axes of these materials in single crystal, powder form along preferential directions so as to compensate for the anisotropy of the superconducting properties of these materials, these metal oxide superconductors are rendered capable of supporting very large current densities.

OBJECTS AND SUMMARY OF THE INVENTION

Accordingly, it is an object of the present invention to provide a large current density conducting capability in a superconducting metal oxide polycrystalline material.

It is another object of the present invention to substantially increase the electrical conductivity of a polycrystalline metal oxide conductor by preferential orientation of its crystal structure.

Yet another object of the present invention is to increase the current carrying capacity of a ceramic superconducting material by rendering it in the form of a single crystal, flake-like powder and aligning its crystal axes along preferential directions.

Accordingly, the present invention contemplates aligning the grains of an orthorhombic metal oxide superconductor such that its a- and b-directions, i.e., within the basal plane of each of the crystals, are aligned to permit the polycrystalline metal oxide superconductor to support very large critical current densities.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 3:
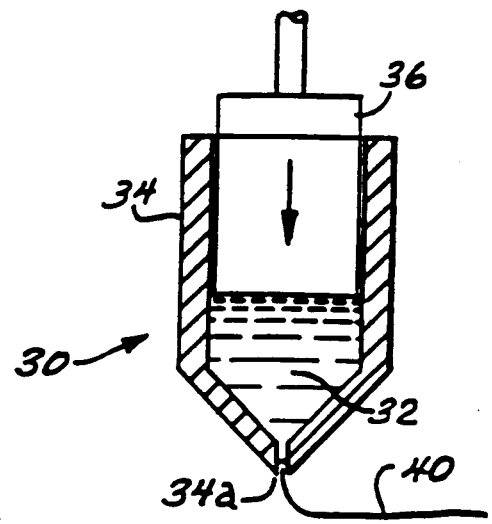
FIG. 3 is an extrusion arrangement for use in the preferential orientation of the crystal particles of a metal oxide superconducting material in accordance with the present invention.

Initial measurements on polycrystalline samples of oxide superconductors such as YBa$_2$Cu$_3$O$_{7-x}$ (where $0 < X < 0.5$) have shown that the current carrying capacity of these materials is not large enough to allow these materials to serve in practical applications. For example, recent measurements have indicated that these materials are only capable of supporting current densities on the order of 100–1000 amps/cm$^2$ in zero magnetic field. This current carrying capacity is clearly inadequate from a practical standpoint when compared with critical current densities on the order of 10,000–100,000 amps/cm$^2$ generally available in other superconducting materials. In addition, these limited current densities observed in metal oxide superconductors of this type are substantially reduced (as much as 100 times less) by the application of relatively small magnetic fields. Recent work performed at International Business Machines (IBM) as described at the American Ceramic Society Meeting in Pittsburgh, Pa., in April 1987 indicates that this is not an intrinsic problem with these metal oxide superconducting materials, since textured, thin-film materials have been produced which are capable of supporting very large current densities (>100,000 amps/cm$^2$). The aforementioned IBM work further indicates that the a- and b-directions, i.e., within the basal plane, of the orthorhombic $YBa_2Cu_3O_{7-x}$ are capable of supporting on the order of 30–100 times the critical current density which can be achieved in the c-direction, i.e., normal to the basal plane.

The reason for this inability of bulk metal oxide superconductors to support the large current densities necessary in virtually all practical applications appears to be a lack of alignment between adjacent grains of $YBa_2Cu_3O_{7-x}$ which carry the current in the superconducting state. This lack of alignment between adjacent grains is believed to restrict current transport to that available only by means of Josephson tunnelling and thus represents a severe limitation on current handling capability in magnetic fields. Evidence to support this finding can be found in both the small current densities and the strong field dependence of the conductivity of these materials.

This problem is avoided in the present invention by orienting the crystalline axes of different grains of these metal oxide superconducting materials along common directions to facilitate current transport across these grain boundaries. Polycrystalline oxide superconductors in accordance with the present invention are comprised of particles each of which is essentially a single crystal and which may be synthesized by either (1) growing bulk single crystals and grinding these single crystals into a powder, or (2) carrying out long-term annealing of powder samples of these polycrystalline metal oxide materials at temperatures near the melting temperature in order to promote large single crystal grain growth, followed by the grinding of these materials into fine powders.

In one approach leading to the present invention, a metal oxide superconductor such as $YBa_2Cu_3O_{7-x}$ (where $0<X<0.5$) is provided in powder form using any one of several conventional methods well known to those skilled in the relevant arts. This polycrystalline powder is then pressed into a compact form such as in the shape of pellets by means of a hydrostatic press in a conventional manner. The compacted polycrystalline powder is then heated to a temperature on the order of its melting point, i.e., to a temperature in the range of 950°–1000° C. for yttrium barium copper oxide which has a melting point of approximately 1025° C. The metal oxide material is sintered at these high temperatures for an extended period of time, e.g., on the order of 20–60 hours, in order to induce large grain growth. After sintering the metal oxide material at the aforementioned temperatures for the stated period of time, grains on the order of 100 microns in diameter are produced in the compacted crystal structure.

The sintered, large grained metal oxide crystal structure is then ground to a powder comprised of single crystal particles. The thus formed superconducting powder has a flake-like morphology such that the c-axis of the individual crystals is aligned parallel to the short dimension of the disc-like flake. The metal oxide particles thus take on the general form of a flattened disc where the a- and b-directions are in the plane of the disc and the c-axis is oriented generally perpendicular to the plane of the disc. All of the crystal particles thus have generally the same orientation. Tapes and/or wires processed from these powders have the a- and b-directions of the crystal particles oriented along the planes of the Cu and O conducting layers throughout the bulk of the wire or tape and thus permit a large critical current to be conducted within the conductor. In grinding the superconducting crystals down to a size much less than the original grain size, the compact superconducting metal oxide material is cleaved along the crystal axes resulting in platelets, or small flat bodies having the aforementioned disc-like shape. The high critical current density axes of these platelets lies in the plane of its disc-like shape.

In order to improve grain growth, impurities may be added to the metal oxide crystal material to produce larger grained structures. The addition of barium cuprate ($BaCuO_2$) to the metal oxide crystal material provides an excess of barium oxide and copper oxide, which form a low temperature eutectic with a melting temperature of about 880° C. lower than the sintering temperatures used. The low melting points of the barium oxide and copper oxide eutectic allow for increased diffusion within the metal oxide powder mixture producing larger grain growth. The other approach referred to above in producing the metal oxide crystal powder, i.e., growing bulk single crystals and grinding them into a powder, may be accomplished by growing each crystal from a similar melt using a molten bath. The difference between the two techniques lies in the amount of second phases one wishes to tolerate. In the molten bath technique large amounts of second phase must be removed from the mixture in order to obtain the desired $YBa_2Cu_3O_{7-x}$ crystals.

Figure 1:
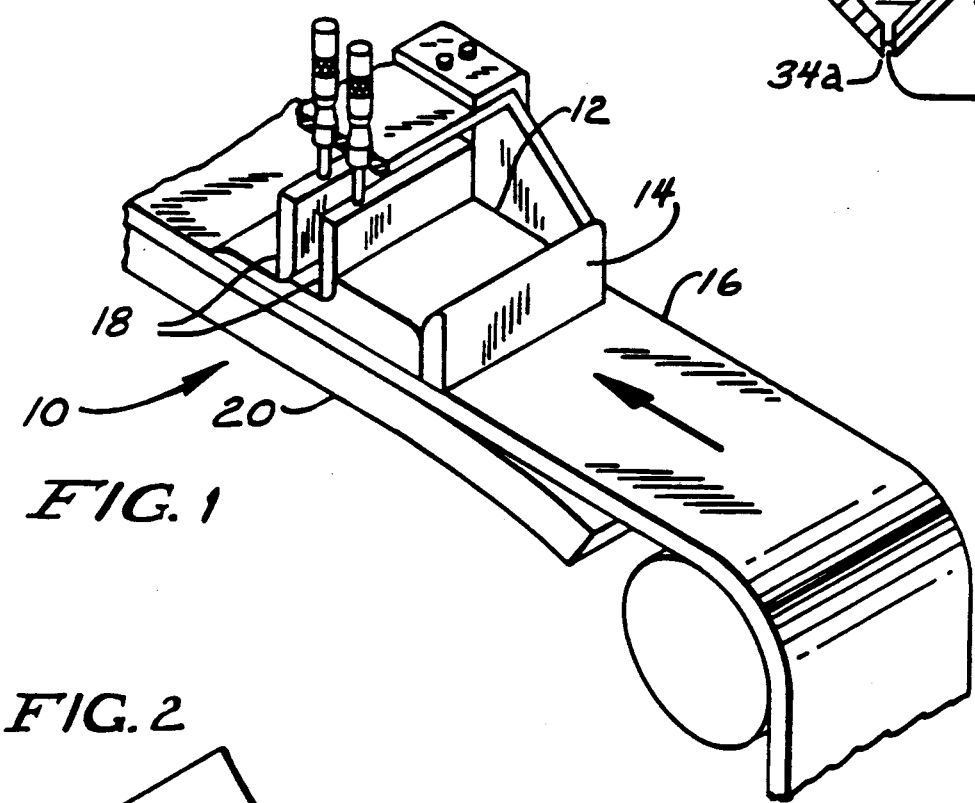
FIG. 1 is a simplified schematic diagram of a tape casting apparatus for use in the preferential orientation of the crystal particles of a metal oxide superconducting material in accordance with the present invention.

After producing the metal oxide crystal powders in which the particles are predominantly single crystallites, various approaches may be taken to orient the crystal particles along common axes. For example, as shown in FIG. 1, a tape casting apparatus 10 may be used in aligning the crystal particles along common axes. In the tape casting apparatus 10, a slip 12, comprised of a suitable mixture of single crystal powder, binders and plasticizers, is spread onto a tempered glass bed or other suitable flat surface 20 with a doctor blade 18 which produces the desired thickness. As the slip is drawn beneath the doctor blade 18, the individual crystal particles contained within are oriented such that their c-axes are aligned generally perpendicular with the plane of the tape. This is due to the flake-like discs aligning parallel to the plane of the tape.

Figure 2:
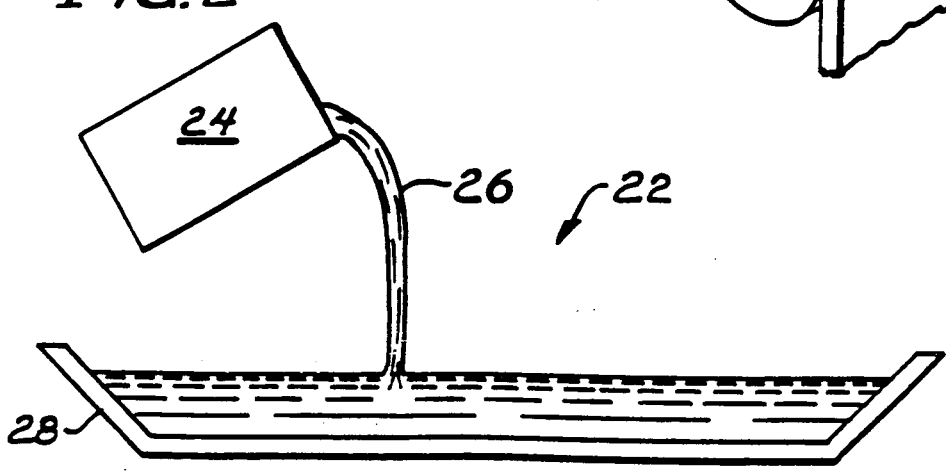
FIG. 2 is a simplified schematic diagram of a slip casting apparatus for use in the preferential orientation of the crystal particles of a metal oxide superconducting material in accordance with the present invention.

Referring to FIG. 2, there is shown another alternative approach which can be used for the preferential orientation of the individual crystal particles of the metal oxide powder. In the approach illustrated in FIG. 2, a slip casting arrangement 22 includes a plaster mold 28 into which a mixture 26 of the metal oxide powder crystals and a binder and solvent are poured from a container 24. The plaster mold 28 absorbs the binder and solvent leaving only the metal oxide crystals remaining in the plaster mold. Because of the plate-like shape of the individual crystals and their tendency not to remain in an on-end orientation, the crystal particles remaining in the plaster mold 28 are generally aligned in a flat orientation with their shorter c-axis aligned generally vertically.

Referring to FIG. 3, there is shown yet another arrangement for orienting the metal oxide crystals along a preferential axis. In the approach of FIG. 3, an extrusion apparatus 30 includes a container 34 within which a partially dried slip containing the metal oxide powder 32 having a putty-like texture is disposed. The container 34 includes a small tapered aperture 34a on a lower portion thereof. The downward displacement of a pusher element 36 against the slip 32 within the container 34 forces the mixture out of the container's aperture 34a. The thus extruded metal oxide powder is in the form of a wire 40. The physics producing alignment in the tape casting technique is the same in this technique and hence one can expect orientation using extrusion as well.

There has thus been shown an improved metal oxide superconducting material with enhanced current-carrying capability. The metal oxide material is comprised of a powder wherein each of the particles is a single crystal having an orthorhombic structure and an anisotropic conductive characteristic. Each of the crystals is aligned along a preferential direction such that the desired direction of current conduction is aligned with the high critical current layers of the superconductor crystal structure. Various mechanical means may be used for the preferential orientation of the individual metal oxide crystals such as slip casting, tape casting, or extrusion.

While particular embodiments of the present invention have been shown and described, it will be obvious to those skilled in the art that changes and modifications may be made without departing from the invention in its broader aspects. For example, while the present invention is described in terms of a superconducting crystal powder comprised of yttrium barium copper oxide, this invention contemplates a superconducting material comprised of virtually any rare earth metal oxide having a crystal structure such as orthorhombic which possesses an anisotropic superconducting characteristic. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. A method of forming a superconducting copper oxide with improved current carrying capacity wherein said superconducting copper oxide has a polycrystalline structure and is anisotropically superconducting having one or more longer crystal axes along which said copper oxide is superconducting, said method comprising the steps of:

pressing the superconducting copper oxide into a compact form;

heating the compacted superconducting copper oxide to a temperature in the range of 950°–1000° C. for on the order of 20–60 hours to induce large grain growth in the superconducting copper oxide;

reducing the superconducting copper oxide to a flake-like, powder form, wherein the copper oxide powder is comprised of particles of singles crystals; and aligning said copper oxide single crystal particles along a preferential direction such that said one or more longer axes of each of said copper oxide crystals are in co-planar alignment, wherein the axes of said copper oxide crystals are along mutually orthogonal a-, b-, and c-directions, and wherein said a- and b-directions define a basal plane of said crystals within which said copper oxide is superconducting and the c-directions of each of said copper oxide crystals are aligned generally parallel.

2. The method of claim 1 wherein said superconducting copper oxide is a rare earth superconducting copper oxide.

3. The method of claim 2 wherein said rare earth superconducting copper oxide is $YBa_2Cu_3O_{7-X}$, where $0 < X < 0.5$.

* * * * *